United States Patent [19]

Gervay et al.

[11] 3,718,473

[11] Feb. 27, 1973

[54] PHOTOPOLYMERIZABLE ELEMENTS CONTAINING HYDRO PHILIC COLLOIDS AND POLYMERIZABLE MONOMERS FOR MAKING GRAVURE PRINTING PLATE RESISTS

[75] Inventors: Joseph Edmund Gervay, Red Bank; Peter Walker, Colts Neck, both of N.J.

[73] Assignee: E. I. du Pont de Nemours and Company, Wilmington, Del.

[22] Filed: Jan. 27, 1971

[21] Appl. No.: 110,319

Related U.S. Application Data

[60] Division of Ser. No. 864,206, Oct. 6, 1969, abandoned, which is a continuation-in-part of Ser. Nos. 766,329, Oct. 9, 1968, abandoned, and Ser. No. 849,297, Aug. 7, 1969, abandoned.

[52] U.S. Cl. ........................96/83, 96/35.1, 96/36.3, 96/86 P, 96/87 R, 96/115 P

[51] Int. Cl. ..........G03c 1/90, G03c 1/68, G03c 1/70

[58] Field of Search ......96/86 P, 83, 115 P, 35.1, 87, 96/36.3

[56] References Cited

UNITED STATES PATENTS

| | | | |
|---|---|---|---|
| 3,469,982 | 9/1969 | Celeste | 96/35.1 |
| 3,418,118 | 12/1968 | Thommes et al. | 96/11 |
| 3,579,339 | 5/1971 | Chang et al | 96/74 |
| 3,055,758 | 9/1962 | McDonald | 96/87 X |
| 3,479,185 | 11/1969 | Chambers | 96/84 |

*Primary Examiner*—Ronald H. Smith
*Attorney*—Lynn Barratt Morris

[57] ABSTRACT

A photopolymerizable element comprising a support strippable from a photopolymerizable layer comprising a hydrophilic, macromolecular organic polymer dispersion medium including a dispersed phase containing (1) at least one ethylenically unsaturated monomer having a boiling point above 100° C. at normal atmospheric pressure and being capable of forming a high polymer by free-radical initiated, chain-propagating addition polymerization; and (2) in reactive association with said monomer, at least one free-radical photoinitiator activatable by actinic radiation in an amount mount constituting from 0.01 to 20.0 percent by weight of the total solids in said dispersion. The elements are useful for making continuous tone gravure printing plates and printed circuit etching resists. On exposure to actinic radiation, the dispersed monomer droplets polymerize or harden to various degrees and the layer becomes resistant to diffusion of aqueous etching solutions in proportion to the exposing radiation. Exposure, first to a conventional gravure screen pattern then to a continuous tone positive or negative, leaves an image in the resist which may be pressed against and transferred to a moistened metal plate and the support stripped off. The resist-bearing metal plate is then etched with an etching solution, e.g., aqueous ferric chloride, to produce a continuous tone gravure image suitable for printing.

12 Claims, No Drawings

PHOTOPOLYMERIZABLE ELEMENTS CONTAINING HYDRO PHILIC COLLOIDS AND POLYMERIZABLE MONOMERS FOR MAKING GRAVURE PRINTING PLATE RESISTS

This application is a division of Ser. No. 864,206, filed Oct. 6, 1969, now abandoned (which is a continuation-in-part of Ser. No. 766,329, filed Oct. 9, 1968, and Ser. No. 849,297, filed Aug. 7, 1969, both of which are now abandoned).

BACKGROUND OF THE INVENTION

1. Field of the Invention

This invention relates to heterogeneous photopolymerizable compositions, layers and elements useful in the formation of continuous tone gravure images and printed circuit resists and comprising a removable support bearing on its surface a photopolymerizable layer of at least one ethylenically unsaturated monomer dispersed in a hydrophilic binder and an initiator activatable by actinic radiation. The photopolymerizable composition may also be coated directly on the surface to be etched.

This invention also relates to processes of preparing gravure printing plates and printed circuit etching resists using the above described elements.

2. Description of the Prior Art

It is known that photopolymerization can be carried out in such a manner as to reproduce original text and pictorial matter as shown in Assignee's Plambeck U.S. Pat. No. 2,760,863. Practical applications of such a process have been used, for example, in the preparation of relief printing plates by wash-out of unpolymerized areas. Thermal transfer of unpolymerized areas as disclosed in Assignee's Burg and Cohen U.S. Pat. No. 3,060,025, Oct. 23, 1962 can also be used. In compositions of the prior art, it is customary to employ homogeneous mixtures wherein the polymerizable monomer, the photoinitiator, and the binder are all within a single phase. In such a single phase system it is known that severe inhibition of the polymerization reaction is caused by the presence of oxygen. It has been difficult to reproduce continuous tone images by photopolymerization of homogeneous compositions probably because of oxygen inhibition effect.

It is also known of course, to prepare gravure etching resists using a stripping film having a gelatino-silver halide emulsion thereon in the manner taught by Assignee's Grumbine, U.S. Pat. No. 2,993,792. This method and element have enjoyed considerable commercial success. However, the process of use involves several steps which include developing and fixing of the exposed silver halide in liquid processing solutions and which require highly skilled technicians to carry out. It further requires washing of the unexposed areas of the resist with hot water to remove said areas from the surface before the conventional ferric chloride etching solution is used.

In Thommes & Walker U.S. Pat. No. 3,418,118, patented Dec. 24, 1968, and in assignees' copending application, namely, Chang and Walker, Ser. No. 640,496 filed May 23, 1967, now U.S. Pat No. 3,579,339, issued May 18, 1971, there are described heterogeneous photopolymerizable compositions which are less subject to the above discussed inhibiting effect of oxygen. Such compositions are coated to form both a monolayer and multilayer elements which contain part of a color image-yielding composition and are useful in forming colored images. It is not evident from these applications that similar compositions free of color image-yielding compositions could be used to form gravure and printed circuit etching resists of high quality and requiring a minimum number of simple steps to carry out the process.

SUMMARY OF THE INVENTION

The photopolymerizable dispersion of this invention comprises a hydrophilic, organic, macromolecular polymer dispersion medium including a dispersed phase containing:

1. at least one ethylenically unsaturated monomer having a boiling point above 100° C. at normal pressure, being capable of forming a high polymer by free-radical initiated, chain-propagating addition polymerization, and 2. in reactive association with (1) a free-radical photoinitiator activatable by actinic radiation in an amount of from 0.01 to 20.0 percent by weight of the total solids in the composition.

The invention relates to elements having a layer of the dispersion and to processes which comprise, in either order, (*a*) exposing to actinic radiation such a layer coated on a support, e.g., transparent film support first through a gravure screen and then to a continuous tone image transparency which gives an image in the resist modulated by photopolymerization, and (*b*) adhering the surface of said layer to the surface to be imaged which has been moistened with water and peeling off the transparent film support, then (*c*) etching the surface to produce an intaglio printing surface with conventional etching solution, e.g., ferric chloride, (*d*) washing the etched surface, e.g., with hot water to remove the residual etching solution and the photopolymer resist. The process may also be carried out by exposing the layer to the gravure screen through the transparent support and to the continuous tone image from the opposite side. In addition, the dispersion may be coated directly on the surface to be etched.

As ethylenically unsaturated compounds there may be used the monomers set forth in Assignee's Plambeck, U.S. Pat. No. 2,760,863, patented Aug. 28, 1956, those set forth in Celeste and Bauer, U.S. Pat. No. 3,261,686, July 19, 1966, those disclosed and claimed in Cohen and Schoenthaler, U.S. Pat. No. 3,389,831, Apr. 30, 1968, the polymerizable polymers disclosed and claimed in Assignee's U.S. Pat. Nos., Schoenthaler 3,418,295 Dec. 24, 1968 and Celeste 3,448,089 June 3, 1969.

Useful free-radical photoinitiators are those disclosed in Plambeck, U.S. Pat. No. 2,760,863, August 28, 1956, Notley, U.S. Pat. No. 2,951,758, Sept. 6, 1960, and any of the photoreducible dyes and reducing agents listed in Oster, U.S. Pat. Nos. 2,850,445; 2,875,047; 3,097,096; and Oster et al., U.S. Pat. Nos. 3,074,794; 3,097,097 and 3,145,104. Depending on the initiating system employed, a single component may be used such as the polynuclear quinones or a polynuclear quinone and another initiator, e.g., Michler's ketone or a multi-component system such as a photoreducible dye and a free-radical producing agent, as described below, can be used.

The thickness of the photopolymerizable layers may vary widely depending upon the type of resist desired. It may vary from 0.0001 inch to 0.001 inch or thicker. Preferably the thickness ranges from 0.0004 to 0.0007 inch.

DESCRIPTION OF THE PREFERRED EMBODIMENTS

In preparing a preferred photopolymerizable dispersion and layer, an aqueous solution or dispersion of a macromolecular organic polymer, e.g., an aqueous gelatin solution, is stirred under high shear during the addition of a non-aqueous or oil phase comprising a solution of at least one addition polymerizable monomer or polymerizable polymer and a photoinitiator in an organic solvent therefor, e.g., ethyl acetate. In order to obtain good dispersions of photopolymerizable droplets, effective surfactants should be present. The surfactant can be admixed with the aqueous gelatin solution. A single addition polymerizable monomer such as pentaerythritol triacrylate is generally satisfactory although a combination of monomers may be used. Polymerizable polymers having a linear carbon backbone chain with extra linear, terminal, ethylenically unsaturated groups such as those disclosed in Assignee's Schoenthaler U.S. Pat. No. 3,418,295 and Celeste U.S. Pat. No. 3,448,089 may also be used. Other agents may be added to the coating composition to control the coating properties and/or the photopolymer reaction mechanism, e.g., cross-linking agents such as N,N'-methylene-bisacrylamide, and diacetone acrylamide, supplemental binders, e.g., polyacrylamide, plasticizers, e.g., glycerol, and a thermal polymerization inhibitor, e.g., p-methoxyphenol, etc. may be used. Ethyl acetate is a suitable choice as an organic solvent in making heterogeneous photopolymer systems because it has a low boiling point and can be removed easily before coating the dispersion without recourse to high temperatures that could damage the emulsion. Also it is a good solvent for the oil phase. Ethyl acetate for example can be removed by heating the dispersion to 50° C. in a rotary evaporator.

Coatings may also be made without using a low boiling solvent. In these cases the oil phase is dissolved in a water-miscible high boiling solvent, e.g., 2-methoxyethanol. This latter system works as well as the temporary low-boiling, water-immiscible, solvent system and eliminates the step of removing said low boiling solvent by evaporation before coating the dispersion. The size of the dispersed photopolymerizable droplets ranges from 0.1 to 10 microns with the majority being about 0.5 micron. Uniformity of dispersion is directly related to the length of time and degree of blending agitation. Dyes for control of halation and image coloration may also be added to the system.

The dispersions can be coated on film support using a suitable coating apparatus, for instance, at a temperature of about 35° C. and about 24 feet per minute. Film supports may be those exposed to electrical discharge after the manner described in Traver U.S. Pat. No. 3,113,208 or exposed to an air/propane flame after the manner described in Bryan U.S. Pat. No. 3,145,242. The coatings are set by chilling and dried at room temperature. The gelatin concentration of the coating composition is the direct determinant of emulsion viscosity and, thus, the indirect determinant of coating weight. The thickness of the dried coated layers will be about 0.0004 to 0.0007-inch, but this is not at all critical and can easily be adjusted, depending on the type of resist and the etching characteristics desired. The support need not be, but preferably is, a transparent film support. Films made of superpolymers such as polyethylene terephthalate are particularly suitable. A gelatin antiabrasion layer about 0.00001 – 0.0003-inch thick, containing a surfactant, may be provided on the photopolymerizable layer.

The process of forming the resist images may be performed in any of the conventional ways of making resist images except that it is unnecessary, as required by the prior art, to remove the unexposed portions of the layer by washing and before etching the support, e.g., copper surface with aqueous ferric chloride solutions. A convenient method of exposure is by means of a vacuum printing frame as exemplified by the Flip Top nuArc Plate Maker exposing device using a xenon lamp as the source of radiation and manufactured by the nuArc Co.,Inc., Chicago, Ill.

Two exposures can be made on the photosensitive resist layer for conventional gravure. One exposure is through a conventional lateral gravure screen followed by an exposure through a continuous tone transparency either negative or positive. The screen exposure may be to the surface of the photosensitive layer or through the transparent support on which the photosensitive layer is coated provided no nonhalation layer has been coated on the back surface. It has been found, surprisingly, that by exposing through the support, the dots have a more desirable configuration. This is because this method prevents undercutting during etching. Undercutting has long been a problem in the gravure field.

The screen can have a ratio of line to dot width of 1:1 although this is not at all critical and may be varied. A single exposure is used where the image being exposed through is already a gravure halftone image.

After the exposing steps, where the dispersion has been coated on a film support, the surface of the exposed layer is adhered to the surface which is to be etched image-wise. The surface to be etched is moistened and the exposed layer transferred by rolling the film resist under a rubber roller into contact with the moistened surface, e.g., a copper plate. The surface to be etched must be thoroughly cleaned to remove impurities such as grease and tarnish. In the case of a copper plate, the surface may be cleaned with the following solution.

| | |
|---|---|
| Glacial acetic acid | 50 ml. |
| Sodium chloride | 250 grams |
| Distilled water | 950 ml. |

After cleaning with the above solution, the plate can be scoured by rubbing with moist Vienna Lime, and finally dried. It is important that the surface be nonrepellent to water. After laydown, the transparent film support is removed from the resist layer by lifting a corner and peeling it back and away from the copper plate.

After removal of the film support an etching solution, e.g., ferric chloride 41–42 Baume, is applied to the resist surface for approximately 25 to 35 minutes or until the plate is etched to the required depth. The image is etched in direct proportion to the amount of hardening in the resist layer because the ferric chloride diffuses through the gelatin at a rate depending on the degree of hardening of the photosensitive layer. Etching may also be done using more than one etching solution e.g., 44 Be for 44 minutes and then 40 Be for 5 minutes.

After etching is completed the copper plate is flushed with hot water to stop the action of the etching solution and to remove the resist layer.

Among the procedures for exposing the photopolymerizable layer are

A. Expose the layer through a contacting gravure screen and then through a contacting continuous tone image. See Examples I–V and VII–XV.

B. Expose the layer through a gravure screen in contact with the support and then through a continuous tone image on the support. See Examples VI and VII.

C. Expose the layer through a halftone image. See Example I.

D. Expose the layer through a halftone and a continuous tone image.

The invention will now be illustrated in and by the following Examples.

EXAMPLE I

An aqueous dispersion was made using the following ingredients:

| | |
|---|---|
| Gelatin | 18.0 g. |
| Water | 250.0 ml. |
| Gum arabic (5% aqueous solution) | 20.0 ml. |
| N,N'-methylenebisacrylamide | 0.5 g. |
| Glycerol | 2.0 ml. |
| Ethyl acetate | 40.0 ml. |
| Benzyl alcohol | 0.5 ml. |
| 9,10-Phenanthrenequinone | 80.0 mg. |
| 4,4'-methenyl-bis-(1-(p-sulfo-phenyl)-3-methylpyrazolone-5) | 100 mg. |
| Polyacrylamide (M.W. 5-6,000,000 | 0.5 g. |
| Pentacrythritol triacrylate | 8.0 g. |
| Acrylated glycidyl methacrylate/acrylonitrile/methyl methacrylate terpolymer (Example V of Schoenthaler U.S. Ser. No. 451,300) | 0.5 g. |
| Phosphate ester (QS-44–Rohm & Haas) | 0.2 g. |
| Ethylene oxide ester of mono & dioctyl phosphate | 0.2 g. |

The dispersion was prepared by agitating in a blender the gelatin, water, gum arabic for 30 seconds followed by the addition of the rest of the ingredients and continuing the agitation for 90 seconds. The ethyl acetate was removed by heating to about 50° C. using a rotary evaporator.

The resulting emulsion was coated under yellow safelight on a polyethylene terephthalate film support at 24 feet per minute at 35° C. The resulting coating was then dried in a conventional manner leaving a photopolymerizable layer having a thickness of about 0.0005 inch.

The resulting film was exposed by placing a 150 line gravure screen in contact with the emulsion surface and placing in a vacuum frame in a Flip Top Xenon nuArc Plate Maker, (nuArc Co., Inc., Chicago, Ill.). The exposure time was 4 minutes and the distance from the film to the xenon arc lamp was 18 inches. The screen was then removed and a $\sqrt{2}$ step wedge was put in place of it on the surface of the emulsion and the film exposed for 2 minutes. After exposure, the emulsion surface was adhered to a water-wetted copper plate by means of rubber rollers. The copper plate, before the lamination, is cleaned as described above. The plate is then wetted with distilled water containing 1% ammonia for the lamination step.

After the lamination or laydown, the film support is removed from the resist by lifting a corner and peeling back and away from the copper plate. This stripping step is preferably but not necessarily done immediately after the laydown step.

After the stripping step, the areas of the plate not covered by the exposed layer were treated with asphaltum to prevent etching in these areas as is conventional in the gravure art. The plate was etched for about 35 minutes using a 41–42 Baume ferric chloride solution. When etching was completed the copper plate was flushed with hot water to stop the action of etching and to remove the resist layer from the copper plate. A good, high quality variable depth image showing 6 $\sqrt{2}$ steps of the wedge etched into the copper plate. The cell wall width was 40 mu in the highlights and 35 mu in the shadows. The cell depth in the shadows was about 30 mu at a density of 1.1, and 10 mu at a density of 0.35. The process was also carried out using a continuous tone positive image in place of the step wedge to form an etching resist and subsequently after etching a high quality gravure printing plate which when placed in a gravure printing press gave good reproductions of the original positive image. The photosensitive element may also be exposed through a gravure halftone positive image to provide a high quality gravure printing plate. A sample of the photosensitive element was exposed to a printed circuit positive image for 3 minutes in the above exposing apparatus and then laminated to a copper-clad phenol-formaldehyde resin plate. The film support was dry-stripped from the laminated element. The copper was etched away completely in 40 minutes using the above 41–42 Baume ferric chloride solution leaving a relief image of the circuit. By washing with hot water the relief image was removed leaving a high quality copper circuit on the phenol-formaldehyde resin plate.

EXAMPLE II

An aqueous dispersion was made according to Example I except that 25 ml. of 2-methoxyethanol was used in place of the ethyl acetate and was not removed after the mixing of the dispersion. The dispersion was coated, exposed and processed as described in Example I to give etching resists of comparable quality.

EXAMPLE III

An aqueous dispersion was made using the following ingredients:

| | |
|---|---|
| Gelatin | 18 g. |
| Water | 350 ml. |
| Gum arabic (5% aqueous solution) | 20 ml. |
| N,N'-methylenebisacrylamide | 0.5 g. |
| Glycerol | 2.0 ml. |
| Ethyl acetate | 40.0 ml. |
| Benzyl alcohol | 0.5 ml. |
| 9,10-phenanthrenequinone | 100.0 mg. |
| 4,4'-methenyl-bis(1-(p-sulfophenyl)-3-methylpyrazolone-5) | 100.0 mg. |
| Pentacrythritol triacrylate | 13.0 g. |
| Acrylated glycidyl methacrylate/acrylonitrile/methyl methacrylate terpolymer (Example V of Schoenthaler U.S. Pat. No. 3,418,295 | 0.5 g. |

| | |
|---|---|
| Phosphate ester (Triton QS–44–Rohm & Haas) | 0.2 g. |
| Ethylene oxide ester of mono and dioctyl phosphate | 0.2 g. |

The dispersion was prepared by agitating in a blender, the gelatin, water, gum arabic for 30 seconds followed by addition of the rest of the ingredients and continuing agitation for 90 seconds. The ethyl acetate was removed by heating to about 50° C using a rotary evaporator.

The resulting emulsion was coated, dried and processed as described in Example I to give good resist layers by means of which printing plates were obtained which gave good gravure reproductions and from which printed circuits were obtained.

EXAMPLE IV

Example III was repeated except that 0.5 gram of polyacrylamide and 5 more grams of pentaerythrital triacrylate were added to the formula of that Example. Coated resists gave improved results in terms of increased speed of 5 times, and in density gradation, which is attributed to the increase in the monomer concentration in the composition.

EXAMPLE V

An aqueous dispersion was made using the following ingredients:

| | |
|---|---|
| Gelatin | 18.0 g. |
| Water | 350.0 mls. |
| Gum arabic (5% aqueous solution) | 20.0 mls. |
| N,N'-methylenebisacrylamide | 0.5 g. |
| Glycerol | 2.0 ml. |
| 2-methoxyethanol | 25.0 mls. |
| Benzyl alcohol | 0.5 ml. |
| 9,10-phenanthrenequinone | 100.0 mg. |
| 4,4'-methenyl-bis(1-(p-sulfophenyl)-3-methylpyrazolone-5) | 100.0 mg. |
| Polyacrylamide (M.W. 5–6,000,000) | 0.5 |
| Trimethylolpropane triacrylate | 18.0 g. |
| Ethylene oxide ester of mono and dioctyl phosphate | 0.2 g. |

The ingredients were mixed as described in Example I and coated, dried and processed to form resists from which gravure plates were made.

EXAMPLE VI

An aqueous dispersion was made using the following ingredients:

| | |
|---|---|
| Gelatin | 18.0 g. |
| Water | 350.0 mls. |
| Gum arabic (5% aqueous solution) | 20.0 mls. |
| Glycerol | 2.0 ml. |
| 2-methoxyethanol | 25.0 mls. |
| Benzyl alcohol | 0.5 ml. |
| 9,10-phenanthrenequinone | 100.0 mg. |
| 4,4'-methenyl-bis(1-(p-sulfophenyl)-3-methylpyrazolone-5) | 100.0 mg. |
| Polyacrylamide (M.W. 5–6,000,000) | 0.5 g. |
| Trimethylolpropane triacrylate | 15.0 g. |
| Phosphate ester (Triton QS–44–Rohm & Haas) | 0.2 g. |

The ingredients were mixed, coated, dried and processes as in Example I to form resists having a thickness of 0.0005 inch from which gravure plates were made. The coating was exposed through a gravure screen in contact with the film support and to a continuous tone $\sqrt{2}$ step wedge image from the opposite side. An image of 12 $\sqrt{2}$ steps was obtained. The plate was etched for 21 minutes in 41°–42° Baume ferric chloride solution. By this method, the gravure wells and cell walls were improved considerably in shape and thickness, and it obviated any tendency toward undercutting by the etching solution. The cell depth at a density of 0.18 was 8 microns, and at a density of 1.86, the depth was 28 microns. The cell wall thickness in the shadows was 10 microns.

EXAMPLE VII

Example VI was repeated except that 40 mls. of the low boiling solvent, ethyl acetate was used in place of the 2-methoxyethanol and 0.5 gram of N,N'-methylene-bisacrylamide was added. This solvent was removed by evaporation as in Example I. Results similar to those of Example VI were obtained.

EXAMPLE VIII

An aqueous dispersion was prepared using the following ingredients:

| | |
|---|---|
| Gelatin | 18.0 g. |
| Water | 350.0 mls. |
| N,N'-methylenebisacrylamide | 0.5 g. |
| Glycerol | 2.0 mls. |
| 2-methoxyethanol | 25.0 mls. |
| Benzyl alcohol | 0.5 mls. |
| 9,10-phenanthrenequinone | 150.0 mg. |
| 4,4'-methenyl-bis(1-(p-sulfophenyl)-3-methylpyrazolone-5) | 100.0 mg. |
| Polyacrylamide (M.W. 5–6,000,000) | 0.5 g. |
| Trimethylolpropane triacrylate | 15.0 g. |
| Phosphate ester (Triton QS–44–Rohm & Haas) | 0.2 g. |

The coated photosensitive layer was exposed to a gravure screen (1:1 dot to line ratio) through the emulsion side for 3 minutes and then to a continuous tone positive for 1 minute. The etched gravure plate showed good well formation and good cell wall structure having substantially the same dimensions as Example VI. The higher amount of initiator appeared to contribute to the quality of the etched image, along with the different gravure screen ratio (1:1).

EXAMPLE IX

An aqueous dispersion was prepared using the following ingredients:

| | |
|---|---|
| Gelatin | 18.0 g. |
| Water | 350.0 mls. |
| Gum arabic (5% aqueous solution) | 20.0 mls. |
| N,N'-methylenebisacrylamide | 0.5 g. |
| Glycerol | 2.0 mls. |
| 2-methoxyethanol | 30.0 mls. |
| Benzyl alcohol | 0.5 ml. |
| 9,10-phenanthrenequinone | 100.0 mg. |
| 4,4-methenyl-bis-(1-(p-sulfophenyl)-3-methylpyrazolone-5) | 100.0 mg. |
| Pentaerythritol triacrylate | 8.0 g. |
| Trimethylolpropane triacrylate | 8.0 g. |
| Polyacrylamide (M.W. 5–6,000,000) | 0.5 g. |
| Phosphate ester (Triton QS–44–Rohm & Haas) | 0.2 g. |

A satisfactory gravure printing plate was obtained from the photosensitive layer which had a dry thickness of 0.0005 inch.

EXAMPLE X

Example VIII was repeated using 100 milligrams of the photoinitiator, 2,7-di-tertiary-butylphenanthrenequinone in place of 9,10-phenanthrenequinone. Results comparable to that example were obtained.

EXAMPLE XI

Example VIII was repeated using 100 milligrams 4,4'-bis-dimethylaminobenzophenone (Michler's ketone) in place of 9,10-phenanthrenequinone as the initiator with results comparable to those obtained in that Example.

EXAMPLE XII

Example VIII was repeated using 22.5 grams of trimethylolpropane triacrylate instead of 15 grams. Decreasing the gelatin-monomer ratio improved the resolution and increased the speed of the photosensitive layer 4 times without any decrease in the quality of the etched image on the gravure plate.

EXAMPLE XIII

Example VIII was repeated except that 18 grams of trimethylolpropane triacrylate was used and 25 milligrams of p-methoxyphenol, a thermal polymerization inhibitor, was added to the formula. The incorporation of the thermal polymerization inhibitor into the emulsion resulted in a decrease in speed of the resist. The resist layer was 0.0005-inch in thickness and, after exposure and the laydown on a copper plate as described in Example I, a good, high quality gravure printing plate was obtained by etching through the resist layer.

EXAMPLE XIV

Example VIII was repeated except that 0.5 gram of diacetone acrylamide was used in place of N,N'-methylenebisacrylamide and 18 grams of trimethylolpropane triacrylate was used in the composition. This formula provided a good photosensitive resist layer when coated as described in Example I.

While the invention is primarily directed to emulsion layers containing only a small amount of an antihalation dye, colorant dyes may be incorporated in the layers, for various reasons. A group of useful dyes are those which are photoreducible and in color image producing system the color is removed preferentially in exposed areas leaving behind a positive colored image in the film resist. Suitable dyes such as Safranine Bluish (C.I.Basic Violet 5),Rose Bengal (C.I. Acid Red 94), Proflavine (3,6-diaminoacridinium monohydrogen sulfate), Methylene Blue (C.I. Basic Blue 9), Erythrosin B (C.I. Acid Red 51) and Azure A (C.I. Pigment Blue 29) when incorporated in the system will produce a positive image on exposure to actinic radiation, and in some cases is accompanied by an improvement in speed or light sensitivity when compared to the previous Examples I - XIII not containing the photoreducible dyes. Any of the dyes may be used in combination.

EXAMPLE XV

An aqueous dispersion was made using the following ingredients:

| | |
|---|---|
| Gelatin | 18.0 g. |
| Water | 350.0 ml. |
| Diacetone acrylamide | 0.9 g. |
| Glycerol | 2.0 ml. |
| 2-methoxyethanol | 25.0 ml. |
| Benzyl alcohol | 0.5 ml. |
| 9,10-phenanthrenequinone | 200.0 mg. |
| 4,4'-methenyl-bis(1-(p-sulfophenyl)-3-methylpyrazolone-5) | 100.0 mg. |
| Polyacrylamide (M.W. 5,6,000,000 | 0.5 g. |
| Trimethylolpropane triacrylate | 18.0 g. |
| Phosphate ester (Triton QS-44-Rohm & Haas) | 0.2 g. |
| Thionine (Lauth's Violet—C.I. 52000) | 100.0 mg. |

The dispersion was prepared by blending as described in Example I. The resulting emulsion which had a blue color was coated under yellow safelight at 24 ft. per minute at 35° C on a transparent 0.007 inch thick polyethylene terephthalate film support. The coating was dried and the dried layer had a thickness of approximately 0.0006 inch. The resulting photosensitive layer was exposed to actinic radiation through a gravure screen (150 line, 2–½1 dot to line ratio) for 3 minutes and then to a continuous tone positive transparency for 1 minute in the exposing apparatus described in Example I. A blue colored positive image resulted by virtue of the fact that during photopolymerization in the exposed areas the dye was photobleached. Lamination and etching were carried out as described above to leave a high quality gravure plate.

EXAMPLE XVI

Example XV was repeated using 200 mg. of thionine instead of 100 mg. and 200 mg. Michler's ketone in place of the 9,10-phenanthrenequinone. Results were comparable to those in that Example.

EXAMPLE XVII

Example XV was repeated using 300 mg. of thionine instead of 100 mg. and 100 mg. of 9,10-phenanthrenequinone and 100 mg. of Michler's ketone as the initiating system. The antihalation dye was omitted from the composition. A high quality gravure plate was obtained.

EXAMPLE XVIII

The dispersion of Example XIV was coated at 95° C. directly on a copper plate prepared as described above. The plate was dried to about 0.001 inch. The layer was exposed to a halftone positive for 3 min., as described in Example I, and etched to give a gravure halftone image of variable size dots and wells of equal depth.

EXAMPLE XIX

Example XV was repeated using 100 mg. of Safranine Bluish (C.I. Basic Violet No. 5) in place of the thionine and 150 mg. of 9,10-phenanthrenequinone. The resulting coated layer had a thickness of 0.0006 inch and a magenta positive image resulted from exposure to actinic radiation. A speed increase of 12 steps on the $\sqrt{2}$ step wedge was observed as compared to standard compositions without Safranine Bluish.

EXAMPLE XX

Example XV was repeated except that 100 mg. of Azure-A (C.I. Pigment Blue 29) was used in place of thionine and 150 mg. of 9,10-phenanthrenequinone and 100 mg. of Michler's ketone was used as the initiating system. The antihalation dye was omitted from the emulsion, but a carbon black antihalation layer was coated on the back of the support. On exposure, blue positive image was obtained in the resist layer. A gravure plate of comparable quality was obtained on etching for 50 minutes in 43.5° Baume ferric chloride solution and 10 minutes in a 40.5° Baume solution and removal of the resist layer. The photospeed of the resist increased by 9 steps on the step wedge ( $\sqrt{2}$) compared to standard coatings without Azure A. The cell depth at a density of 0.45 was 8 microns, and at a density of 1.59, the depth was 30 microns. The wall width in the highlights was 50 microns and 54 microns in the shadows.

EXAMPLE XXI

Example XV was repeated using 150 mg. of 9,10-phenanthrenequinone as the initiating system and 100 mg. of 4,4'-methenyl-bis(1-(p-sulfophenyl)-3-methyl pyrazolone-5). The results were comparable to previous examples, except that the speed of the resist increased 7 steps ( $\sqrt{2}$ step wedge) compared to standard compositions without Azure-A.

EXAMPLE XXII

A .007-inch sheet of polyethylene terephthalate was treated on one surface with a copolymer subbing composition, and provided with a gelatin anchoring layer as in Ex. IV of Alles U.S. Pat. No. 2,779,684. The following coating composition was prepared:

| | |
|---|---|
| Water | 6000 g. |
| Gelatin | 1000 g. |

The composition was soaked for 10 mins. at room temperature, and heated for 25 mins. at 125° F., and then cooled to 105° F., at which time there was added a mixture of

| | |
|---|---|
| Ethanol | 1300 g. |
| Water | 1300 g. |

and admixed in order, the following materials

| | |
|---|---|
| p-Tert-octylphenol | 440 ml |
| 3N NaOH | 300 ml |

Solution A

| | |
|---|---|
| Water | 1830 g. |
| 4,4'-Methenyl-bis-(1-(p-sulfo-phenyl)-3 methylpyrazolone-5) | 320 g. |

Solution B

| | |
|---|---|
| Water | 1950 g. |
| 2-Hydroxy-4-methoxy-5-Sulfobenzophenone | 200 g. |

Solution C

| | |
|---|---|
| Water | 2050 g. |
| C.I. fluorescent brightening agent 26 | –100 g. |

The resulting dispersion was skim-coated to a thickness of .00025 inch on the treated surface of the support.

A dispersion was prepared by mixing the following aqueous and organic phases in a kinetic dispersion mill and blending for 15 minutes.

Aqueous Phase

| | |
|---|---|
| Gelatin | 18 g. |
| Water | 300 ml. |
| Polyacrylamide | 0.5 g. |
| Mixture of the mono + diesters of phosphoric acid with ethylene oxide condensate of nonyl phenol containing about 10 ethylene oxide units/chain | 0.4 g. |
| 22% yellow pigment dispersed in water with 6% nonyl phenoxy poly(ethoxy) ethanol 73% combined ethylene oxide based on weight of nonyl phenol | 1 g. |

Organic Phase

| | |
|---|---|
| Trimethylolpropane triacrylate | 15 g. |
| Mixed ester of triethylene glycol dicaprate and dicaprylate | 3 g. |
| o-Chlorophenyl 4,5 bis (m-methoxyphenyl) imidazolyl dimer | 1.2 g. |
| Tris-4 (diethylamino-o-tolyl) methane | 0.8 g. |
| 4-Methoxyphenol | 5 mg. |
| Chloroform | 20 ml. |

The resulting emulsion (pH = 5) was then skim-coated to the untreated side of the support under yellow light at 90° F. at a rate of 40 ft./min. The coating was dried in a conventional manner leaving a photopolymerizable layer having a thickness of .00044 inch.

The photopolymerizable film was exposed by placing a 150-line gravure screen in contact with the emulsion surface and placing it in a Flip Top Carbon nuArc Plate Maker. The film was exposed for 2 minutes at a distance of 18 inches from the carbon arc. The screen was then removed and a 21-step $\sqrt{2}$ step wedge was put in place of it on the surface of the film, and the element exposed for 5 seconds. After exposure, the emulsion surface was cleaned and adhered through rubber rollers to a wetted copper plate as in Ex. I. The copper was wetted, after cleaning and prior to lamination, with a mixture (1:1) of distilled water and methanol.

After lamination, the film support is removed from the resist by peeling back and away from the copper plate.

After stripping the support, the areas of the plate not covered by the exposed layer were treated with asphaltum. The plate was then etched for 38 minutes using a 45.5° Baume ferric chloride solution. After the etching was completed, the copper was flushed with hot water to stop the action of etching and to remove the resist layer from the copper plate. A high-quality, variable-depth image showing 5 $\sqrt{2}$ steps of the wedge etched into the copper plate was obtained.

The process was also carried out using an image-bearing gravure halftone positive instead of the gravure screen and a continuous tone positive image of the same in place of the $\sqrt{2}$ step wedge to form an etching resist. After etching, a high quality gravure printing plate having variable depth and also variable dot size was obtained.

The photosensitive element may also be exposed through a gravure halftone positive image only to provide high quality variable depth and also variable dot size gravure printing plate.

All plates yielded good printed images, when used to print on an appropriate printing press.

EXAMPLE XXIII

The following aqueous dispersion was made and coated according to Ex. XXII to yield a photopolymerizable layer having a thickness of .00043 inches.

| | |
|---|---|
| Gelatin | 18 g. |
| Water | 350 ml. |
| Polyacrylamide | 0.5 g. |
| Mixture of mono and diesters of phosphoric acid with ethylene oxide condensate of nonylphenol containing about 10 ethylene oxide units/chain | 0.4 g. |
| 2-Hydroxy-4-methoxy-5-sulfobenzophenone | 3 g. |
| Trimethylolpropane triacrylate | 15 g. |
| Mixed ester of triethylene glycol, dicaprate and dicaprylate | 3 g. |
| o-Chlorophenyl-4,5-bis (m-methoxy phenyl) imidazolyl dimer | 1.2 g. |
| [4,4′, 4″-methylidynetris (N,N-dimethylaniline)] | 0.8 g. |
| 4-Methoxyphenol | 5 mg. |
| 2-Methoxyethanol | 30 ml. |
| Acetone | 15 ml. |

The film was exposed to the carbon arc first through a 150-line gravure screen for 4 minutes, followed by a 20-second continuous tone exposure to a $\sqrt{2}$ step wedge. Processing was the same as in Ex. XXII. 55 minutes etching in 45.5° Baume ferric chloride yielded gravure plates of comparable quality to those obtained in Ex. XXII, using the same techniques.

A dark violet-colored negative image is noticeable on the resist during the tone exposure. This is due to the fact that in the exposed areas the leuco dye is oxidized and thereby develops color.

EXAMPLE XXIV

The following antiabrasion overcoat composition was prepared:

| | |
|---|---|
| Water | 18,750 g. |
| Gelatin | 250 g. |

This was soaked for 10 mins. at room temperature, then digested for 25 mins. at 120° F., and cooled to 90° F.

A phosphate ester (QS-44 Rohm & Haas) 250 ml. was added, and then there was added the following solution:

| | |
|---|---|
| Ethanol | 250 g. |
| Water | 250 g. |

The composition was overcoated on a photopolymer layer pre-pared as in Ex. XXII, to a thickness of .0001 inch. The thickness of the dried film (photopolymer plus overcoat) was .00045 inch. The film was exposed through a gravure screen to a UV source (Ascor Addalux) for 2 minutes at a distance of 24 inches, followed by a continuous tone exposure for 15 seconds yielding a dark violet negative image. On etching with a 45.5° Baume ferric chloride solution for 45 minutes, good quality variable depth images were obtained on copper plates. Similar high quality gravure printing plates were obtained when the element was exposed to single halftone gravure positives, and etched.

EXAMPLE XXV

Aqueous Phase

| | |
|---|---|
| Gelatin | 540 g. |
| Water | 8000 ml. |
| Mixture of mono + diesters of phosphoric acid with ethylene oxide condensate of nonylphenol containing on the average of 10 ethylene oxide units/chain | 15 g. |
| 22% yellow pigment dispersed in water with 6% nonyl phenoxy poly(ethoxy) oxide based on weight of nonylphenol | 45 g. |

Organic Phase

| | |
|---|---|
| Trimethylolpropane triacrylate | 300 g. |
| Mixed ester triethylene glycol dicaprate and dicaprylate | 150 g. |
| 2-t-Butylanthraquinone | 15 g. |

The aqueous and organic phases were mixed and blended for 15 minutes in a kinetic dispersion mill. The emulsion was then skim-coated at 90° F. at 40 ft./min. to a polyethylene terephthalate base (7 mil) as in Ex. XXII. The dried photopolymer layer was .00054-inch thick. The film resist was exposed through a gravure screen for 6 minutes to a carbon arc (nuArc), and then to a $\sqrt{2}$ continuous tone step wedge. The exposed resist was laminated to a copper plate which was moistened with a 1:1 ethanol/water mixture and the bare portions of copper were masked with acid resistant tape.

Etching was performed using a 45.5° Baume ferric chloride solution, for 35 minutes. A high quality variable depth gravure plate was obtained showing 9 steps of the $\sqrt{2}$ wedge etched in the copper.

EXAMPLE XXVI

| | |
|---|---|
| Gelatin | 18 g. |
| Water | 300 ml. |
| Mixture of mono+diesters of phosphoric acid with ethylene oxide condensate of nonylphenol containing about 10 ethylene oxide units/chain | 0.5 g. |
| Trimethylolpropane triacrylate | 10 g. |
| Carbon black | 1 g. |
| Mixed ester triethylene glycol dicaprate and dicaprylate | 5 g. |
| Phenanthrenequinone | 0.1 g. |

The phenanthrenequinone was dissolved in the mixture of trimethylolpropane triacrylate, and mixed triethylene glycol ester. The 2 phases were mixed and blended for 3 minutes in a kinetic dispersion mill. The emulsion was cooled to a thickness of .0006-inch exposed and processed as in Ex. XXV. Six-minute exposure to a gravure screen, followed by a 10-sec. tone exposure to a $\sqrt{2}$ step wedge, produced a high quality gravure plate upon etching in a 45.5° Baume ferric chloride solution for 39 minutes.

EXAMPLE XXVII

| | |
|---|---|
| Gelatin | 18 g. |
| Water | 300 ml. |
| Phosphate ester (Triton QS-44 Rohm & Haas) | 0.5 g. |
| Carbon Black | 1 g. |
| Trimethylolpropane triacrylate | 10 g. |
| Mixed ester triethylene glycol dicaprate and dicaprylate | 5 g. |
| 2-t-Butylanthraquinone | 0.5 g. |

The anthraquinone initiator was dissolved in the mixture of trimethylolpropane triacrylate and triethylene glycol mixed ester. The aqueous and organic phases were mixed and blended for 3 minutes. The resulting emulsion was coated, dried and processed as set out in Ex. XXIV. Three-minute gravure screen exposure, followed by a 20-second continuous tone exposure and 38 mins. etching in 45.5° Baume ferric chloride, yielded gravure plates comparable to those obtained in previous examples.

EXAMPLE XXVIII

An aqueous dispersion was made as described in Example VIII, except that 100 mg of 9,10-phenanthrenequinone was used instead of 150 mg. The photopolymerizable dispersion was coated and dried under a yellow safelight on a polyethylene terephthalate film support, as described in Example I. The coated film was laminated by means of rubber rollers to a water-wetted copper plate, which had been previously cleaned, as described above. The polyethylene terephthalate film support was stripped off and the photo-polymerizable layer was exposed first to a gravure screen (2-½1 dot to line ratio) for 4 minutes in the exposing device of Example I and then to a $\sqrt{2}$ continuous tone step wedge for 2 minutes. The exposed image was etched with 41.8° Baume ferric chloride solution for 35 minutes to give a good quality copper plate having a well depth at density of 1.62 of 25 microns and a cell wall thickness of 20 microns which gave a good quality halftone image reproduction.

EXAMPLE XXIX

A dispersion was prepared by mixing the following aqueous and organic phases in a kinetic dispersion mill and blending for 15 minutes.

AQUEOUS PHASE

| | |
|---|---|
| Gelatin | 18 g. |
| Water | 325 ml |
| Polyacrylamide | 0.5 g |
| Mixture of the mono and diesters of phosphoric acid with ethylene oxide condensate of nonylphenol containing about 10 ethylene oxide units/chain | 0.4 g |
| 22% yellow pigment dispersed in water with 6% nonylphenoxy poly(ethoxy) ethanol 73% combined ethylene oxide based on the weight of nonylphenol | 1.0 g |

Organic Phase

| | |
|---|---|
| Trimethylolpropane triacrylate | 15 g |
| Mixed ester of triethylene glycol dicaprate and dicaprylate | 3 g |
| o-Chlorophenyl-4,5-bis(m-methoxy phenyl)imidazolyl dimer | 3 g |
| Tris-4-diethylamino-o-tolyl)methane | 1.5 g |
| [4,4',4''-methylidynetris(N,N-dimethyl-aniline] | 0.3 g |
| 4methoxyphenol | 5.0 mg |
| Methylene chloride | 25 ml |

The resulting emulsion was coated on a polyethylene terephthalate film support and dried. The photopolymerizable layer surface was laminated to a water-wetted cleaned copper plate. The photopolymerizable layer on the copper plate was exposed through the film support to a gravure screen halftone step wedge by means of a UV source in an ASCOR ADDALUX exposing device (Model No. 1412-01, manufactured by the Berkey Technical Division of Berkey Photo Inc., Woodside, New York 11377) at a distance of 60 inches for 3 minutes. The film support was stripped off and the exposed plate was etched with 44° Baume ferric chloride for 30 minutes. The plate was then rinsed with hot water to stop the etching action and to remove the resist layer from the copper plate. A good quality gravure plate was obtained which showed at a step density of .35 a well depth of 45 microns and a wall width of 20 microns.

EXAMPLE XXX

A dispersion was prepared by mixing the following aqueous and organic phases in a blender for 5 minutes.

Aqueous Phase

| | |
|---|---|
| polyvinyl alcohol (Elvanol 72–60 grade) manufactured by E. I. du Pont de Nemours and Company. Viscosity of a 4% aqueous solution at 20° C. as determined by Hoeppler falling ball method is 55–65 centipoises | 9.0 g |
| Polyvinyl Alcohol (Elvanol 50–42 grade) viscosity determined as above 35–42 centipoises | 9.0 g |
| Water | 400 ml |
| Mixture of the mono and diesters of phosphoric acid with ethylene oxide condensate of nonylphenol containing about 10 ethylene oxide units/chain | 0.5 g |
| 22% yellow pigment dispersed in water with 6% nonylphenoxy poly(ethoxy) ethanol 73% combined ethylene oxide based on weight of nonylphenol | 1.5 g |

Organic Phase

| | |
|---|---|
| Trimethylolpropane triacrylate | 9.5 g |
| Mixed ester of triethylene glycol dicaprate and dicaprylate | 3 g |
| o-Chlorophenyl-4,5-bis(m-methoxyphenyl) imidazolyl dimer | 3.7 g |
| Tris-4-diethylamino-o-tolyl)methane | 0.2 g |
| 4,4',4''-methylidynetris(N,N-dimethyl-aniline | 0.4 g |
| Methylene chloride | 10.0 g |

The resulting emulsion was coated on the untreated side of the polyethylene terephthalate film described in Example XXII under a yellow light and dried. The element was exposed at 26 inches through a gravure halftone screen step wedge for 15 seconds and the surface of the exposed layer was laminated to a copper plate, the film support stripped off and the copper plate etched in 44.5° Baume ferric chloride for 17 minutes to give a good quality gravure plate. The process was repeated except that the surface of the photo-polymerizable layer was laminated to the copper plate first and then exposed after stripping off the film support. Etching as described above gave an acceptable gravure printing plate capable of giving good gravure image reproduction.

The photosensitive dispersions of this invention may be coated on other supports, preferably transparent, from those in the examples. For example, the stripping films described in Assignee's Grumbine, U.S. Pat. No. 2,993,792 may be used. These films comprise a flexible, hydrophobic, macromolecular organic polymer film base having on one surface in order, a dry-stripping layer, a thin water-insoluble membrane which is soluble in an organic solvent, especially a volatile solvent which is soluble in or miscible in water, an anchor layer having a thickness from about 0.001 to 0.004 mil and a soluble gelatin layer. Another highly useful stripping film is that described in Assignee's Alles, U.S. Pat. No. 3,043,695. This film comprises a hydrophobic organic polymer film support bearing on one surface, in order, a thin layer of a mixture of (1) 40 to 80 parts by weight of an n-butyl methacrylate/itaconic acid copolymer containing 96–99.5 percent by weight of the former with (2) 60 to 20 parts by weight of a vinylidene chloride/methyl methacrylate/itaconic acid copolymer containing at least 35 percent vinylidene chloride, an anchor layer of gelatin. The hydrophobic organic polymer film may be composed of any hydrophobic organic polymer but films formed from the polyesterification product of a dicarboxylic acid and a dihydric alcohol made according to the teachings of Alles et al., U.S. Pat. No. 2,627,088 and Alles, U.S. Pat. No. 2,779,684 are especially useful. A .00025-inch antihalation layer containing a mixture of dyes can be coated on one surface of the support on a copolymer layer of Alles U.S. Pat. No. 2,779,684.

In place of gelatin as the binder in the dispersing medium, other natural or synthetic water-permeable organic colloid binding agents can be used. Such agents include water-permeable or water-soluble polyvinyl alcohol and its derivatives, e.g., partially hydrolyzed polyvinyl acetates, polyvinyl ethers, and acetals containing a large number of extralinear —$CH_2CHOH$ groups; hydrolyzed interpolymers of vinyl acetate and unsaturated addition polymerizable compounds such as maleic anhydride, acrylic and methacrylic acid ethyl esters and styrenes. Suitable colloids of the last mentioned type are disclosed in U.S. Pat. Nos. 2,276,322; 2,276,323: and 2,397,866. The useful polyvinyl acetals include polyvinyl acetaldehyde acetal, polyvinyl butyraldehyde acetal and polyvinyl sodium o-sulfobenzaldehyde acetal. Other useful colloid binding agents include the poly-N-vinyllactams of Bolton, U.S. Pat. No. 2,495,918, the hydrophilic copolymers of N-acrylamido alkyl betaines described in Shacklett, U.S. Pat. No. 2,833,650 and hydrophilic cellulose ethers and esters.

When it is desired to add a binder to the dispersed phase, useful binders are water-insoluble polymers, e.g., methyl methacrylate resins, polyvinyl acetals such as polyvinyl butyral and polyvinyl formal, vinylidene chloride copolymers (e.g., vinylidene chloride/acrylonitrile, vinylidene chloride/methacrylate and vinylidene chloride/vinyl-acetate copolymer, synthetic rubbers (e.g., butadiene/acrylonitrile copolymers, and chloro-2-butadiene-1,3-polymers), cellulose esters (e.g., cellulose acetate, cellulose acetate succinate and cellulose acetate butyrate), polyvinyl esters (e.g., polyvinyl acetate/acrylate, polyvinyl acetate/methacrylate and polyvinyl acetate/polyvinyl chloride and copolymers (e.g., polyvinyl chloride acetate), polyurethanes, polystyrene, etc. When materials such as the above are incorporated in the dispersed phases they may act as viscosity modifiers. For example the viscosity of the droplets may be increased to a point near a "threshold" value whereby an additional increase in viscosity through polymerization may effect a very noticeable change in some physical or chemical property.

Other useful polymeric binders for the dispersed phase are disclosed in Schoenthaler U.S. Pat. No. 3,418,295. These unsaturated polymers can be crosslinked or can be grafted to by growing monomer chains, thus producing an increased physical effect, particularly a greater hardening of the dispersed droplet. From 1 to 10 percent or more by weight of total solids, of a nonpolymerizable plasticizer may be employed in the organic phase of the photopolymerizable dispersion to improve the photographic speed. A preferred plasticizer is the mixed ester of triethylene glycol dicaprylate and dicaprate.

Suitable free-radical initiated, chain-propagating addition polymerizable ethylenically unsaturated compounds include preferably an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Pat. No. 2,927,022, issued Mar. 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester structures. The following specific compounds are further illustrative of this class; unsaturated esters of alcohols, preferably the unsaturated esters of polyols and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polyethylene glycols of molecular weight 200–500, and the like; vinyl esters such as divinyl succinate, divinyl adipate, divinyl phthalate and divinyl terephthalate; styrene and derivatives thereof and unsaturated aldehydes, such as sorbaldehyde (hexadienal). An outstanding class of these preferred addition polymerizable components are the esters of alpha-methylene carboxylic acids and substituted carboxylic acids with polyols and polyamides wherein the molecular chain between the hydroxyls and amino groups is solely carbon or oxygen-interrupted carbon. The preferred monomeric compounds are difunctional, but monofunctional monomers can also be used. In addition, the polymerizable, ethylenically unsaturated polymers of Burg, U.S. Pat. No. 3,043,805, Martin, U.S. Pat. No. 2,929,710 and similar materials may be used alone or mixed with other materials.

In addition to the initiating systems described above the materials capable of absorbing actinic radiation may be a cyanine, carbocyanine, or merocyanine dye. The various cyanine and related dyes have been well known in photography for many years and include such dyes as 3-ethyl-5-(2-ethyl-1-benzoxazylidene-β-methyl ethylidene)-2-thio-2,4 (3,5) oxazoledione (prepared as described in Example 16 of Kendall, U.S. Pat. No. 2,272,163 and dyes of the following formulas:

A

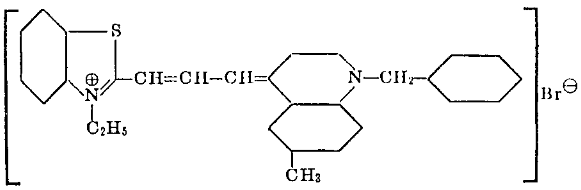

B

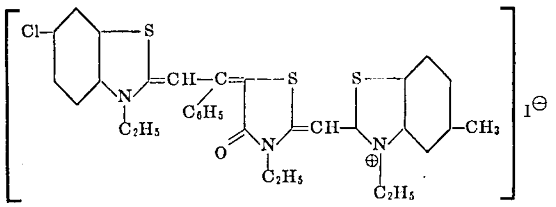

C

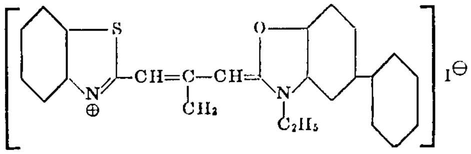

Suitable photoreducible dyes as described above have been disclosed more recently, e.g., in U.S. Pat. Nos. 2,850,445 and 2,875,047.

Also useful are combinations of one or more of the above dyes with quinone type compounds, e.g., phenanthrenequinone in combination with the dye prepared according to Example 16 of Kendall, U.S. Pat. No. 2,272,163. Other useful materials for absorbing actinic radiation are the free-radical generating addition polymerization initiators activatable by actinic light and thermally inactive at or below 185° C. These include the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tertbutylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(*a*)anthracene-7,12-dione. Other photoinitiators which are also useful, even though some may be thermally active at temperatures as low as 85° C., are described in Plambeck U.S. Pat. No. 2,760,863 and include vicinal ketaldonyl compounds, such as diacetyl, benzil, etc., α-ketaldonyl alcohols, such as benzoin, pivaloin, etc., acyloin ethers, e.g., benzoin methyl and ethyl ethers, etc., α-hydrocarbon substituted aromatic acyloins, including α-methylbenzoin, α-allylbenzoin, and α-phenylbenzoin.

Another suitable initiator system that can be used in the photopolymerizable dispersions and elements of this invention is the lophine dimers (2,4,5-triphenylimidazolyl dimers), consisting of two lophine radicals bound together by a single covalent bond, e.g., 2(o-chlorophenyl)-4,5-diphenylimidazolyl dimer and others, described in British Patent specification No. 997,396, published July 7, 1965, and 1,047,569, published Nov. 9, 1966. Suitable free radical producing hydrogen donor agents for use in such systems, e.g., organic amines, mercaptans triphenylmethane dyes, are set forth in the above-stated British Specification Suitable color amine-substituted leuco dyes which function both as a color forming agent and a free radical generating agent can be used in the dispersions of this invention. Especially useful leuco dyes have at least one dialkylamino group. Also, any amine substituted leuco triphenylmethane die or various salts of the dye can be used. Leuco forms of crystal violet which are oxidized upon exposure to form visible images are preferred. Other suitable leuco dyes or their salts are disclosed in Chang et al., U.S. Ser. No. 731,733, filed May 24, 1968.

Since the elements of this invention are for use in a photopolymerizable process it is obvious that they should be stable against thermally initiated polymerization. Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2-6-di-tert-butyl p-cresol, phenothiazine, pyridine, nitrobenzene and dinitrobenzene. Other useful inhibitors include p-toluquinone and chloranil and thiazine dyes, e.g., Thionine Blue G (C.I. Basic Blue 25), Methylene Blue B (C.I. Basic Blue 9) and Toluidine Blue O (C.I. Basic Blue 17). In the particularly preferred embodiments containing certain dye or quinone-type photo-initiators, however, no thermal inhibitor is required since these initiators have a dual function and, in the dark, serve as thermal inhibitors.

Since free-radical generating addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluorescent lamps with ultraviolet radiation-emitting phosphors, argon glow lamps, electronic flash units and photographic flood lamps.

The image, formed by exposure of a heterogeneous system of this invention, depends upon the differential polymerization of the individual droplets in the dispersed phase. Such differences may make the image visible without further treatment, e.g., it is often possible to see a visible relief image.

Although not essential, it is preferred that a surfactant be employed in dispersing the droplets. Such surfactants are alkylnaphthalene sulfonic acid salts, organic esters of phosphoric acid, benzyl alcohol, octyl alcohol, lauryl alcohol, sodium lauryl sulphate, sulphonated derivatives of fatty acid amides, the condensation products of octyl phenol and sorbitan monolaurate with polyethylene oxide, etc.

Additional low boiling solvents which are water immiscible include esters (e.g. ethyl formate, propyl acetate, n-butyl acetate, ethyl butyrate), hydrocarbons (e.g. benzene), chlorinated hydrocarbons (e.g. chloroform, methylene chloride) and ethers (e.g. diethyl ether).

The primary advantage of the heterogeneous photopolymerization system is reduced oxygen sensitivity. Oxygen is known to inhibit photopolymerization but it appears to have little effect in the heterogeneous systems of the present invention, particularly the systems wherein gelatin is used as the binder in the aqueous phase. Oxygen is relatively insoluble in gelatin and has a lower diffusion coefficient in gelatin than in many other binders. The reduced sensitivity to oxygen may explain, in part, the ability of the heterogeneous systems to produce continuous tone reproduction. The reproduction of continuous tones is probably dependent, also, on the variation in sensitivity between dispersed droplets of different sizes. This ability of the heterogeneous system to produce continuous tone images makes possible the use of photopolymerization in conventional photographic materials, particularly for contact or enlargement papers.

The heterogeneous photopolymerization system of this invention shows no significant low intensity reciprocity failure, probably because of its relative insensitivity to oxygen. Also it has been found that stability is excellent, both of the raw stock (unexposed material) and the final resist images that are produced by this process.

The embodiments of the invention in which an exclusive property or privilege is claimed are defined as follows:

1. A photopolymerizable element for the production of diffusion etching resists comprising a support strippable from a photopolymerizable layer comprising a hydrophilic, macromolecular organic polymer dispersion medium including a dispersed phase containing 1. at least one ethylenically unsaturated monomer having a boiling point above 100° C. at normal atmospheric pressure and being capable of forming a high polymer by free-radical initiated, chain-propagating addition polymerization; and
2. in reactive association with said monomer, at least one free-radical photoinitiating system activatable by actinic radiation in an amount constituting from 0.01 to 20.0 percent by weight of the total solids in said dispersion.

2. An element according to claim 1, wherein said support is transparent to actinic radiation.

3. An element according to claim 1, wherein said support is a surface to be etched.

4. An element according to claim 1, wherein said support is copper.

5. An element according to claim 1, wherein said macromolecular organic polymer is gelatin.

6. An element according to claim 1, wherein said monomer is pentaerythritol triacrylate.

7. An element according to claim 1, wherein said monomer is trimethylolpropane triacrylate.

8. An element according to claim 1, wherein pentaerythritol triacrylate and trimethylolpropane triacrylate are present as constituent (1).

9. An element according to claim 1, wherein said initiator is 9.10 phenanthrenequinone.

10. An element according to claim 1, wherein said dispersion medium contains gelatin and polyacrylamide.

11. An element according to claim 1, wherein the dispersed phase contains 3. a free-radical-producing hydrogen donor agent, and
4. a 2,4,5-triarylimidazolyl dimer consisting of two lophine radicals bound together by a single covalent bond.

12. An element according to claim 11, wherein said dimer is a 2,4,5-triphenylimidazolyl dimer.

* * * * *